US012727323B2

(12) United States Patent
Nie

(10) Patent No.: US 12,727,323 B2
(45) Date of Patent: Sep. 1, 2026

(54) DISPLAY PANEL AND DISPLAY MODULE

(71) Applicant: Wuhan China Star Optoelectronics Semiconductor Display Technology Co., Ltd., Wuhan (CN)

(72) Inventor: Dawen Nie, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 1060 days.

(21) Appl. No.: 17/780,095

(22) PCT Filed: May 23, 2022

(86) PCT No.: PCT/CN2022/094355
§ 371 (c)(1),
(2) Date: May 26, 2022

(87) PCT Pub. No.: WO2023/206670
PCT Pub. Date: Nov. 2, 2023

(65) Prior Publication Data

US 2023/0354640 A1 Nov. 2, 2023

(30) Foreign Application Priority Data

Apr. 27, 2022 (CN) ......................... 202210457934.2

(51) Int. Cl.
*H10K 50/86* (2023.01)

(52) U.S. Cl.
CPC .................................. *H10K 50/865* (2023.02)

(58) Field of Classification Search
CPC ........ H10K 50/11; H10K 50/15; H10K 50/16; H10K 50/171; H10K 2101/30;
(Continued)

(56) References Cited

U.S. PATENT DOCUMENTS

2004/0046909 A1* 3/2004 Sekiguchi ........... G02F 1/13452 349/113
2004/0256983 A1 12/2004 Hung et al.
(Continued)

FOREIGN PATENT DOCUMENTS

CN 104078489 10/2014
CN 104393016 3/2015
(Continued)

OTHER PUBLICATIONS

Notification of Office Action and Search Report Dated Mar. 31, 2023 From the State Intellectual Property Office of the Poeple's Republic of China Re. Application No. 202210457934.2 and Its Translation Into English. (23 Pages).
(Continued)

*Primary Examiner* — Moin M Rahman

(57) ABSTRACT

A display panel and a display module are provided. The display panel includes a substrate and a light-emitting device layer located on the substrate. The light-emitting device layer includes a plurality of effective light-emitting regions and a non-light-emitting region. The display panel further includes a first light absorbing layer, and the first light absorbing layer is disposed on a side of the light-emitting device layer facing a light-emitting side of the display panel, and is disposed corresponding to the non-light-emitting region. The first light absorbing layer is configured for absorbing an ambient light reflected by a metal electrode in the non-light-emitting region to replace a polarizer.

18 Claims, 4 Drawing Sheets

(58) Field of Classification Search

CPC ......... H10K 2101/40; H10K 2102/351; H10K 50/852; H10K 59/35; H10K 59/12; H10K 50/156; H10K 2101/00; H10K 50/844; H10K 59/131; H10K 77/111; H10K 50/805; H10K 50/856; H10K 50/8445; H10K 50/85; H10K 59/10; H10K 59/129; H10K 2102/311; H10K 2102/361; H10K 71/00; H10K 85/615; H10K 85/624; H10K 85/626; H10K 85/631; H10K 85/633; H10K 85/636; H10K 85/6572; H10K 50/155; H10K 50/115; H10K 50/13; H10K 50/80; H10K 85/6574; H10K 59/873; B60K 37/02; B60K 2370/1523; B60K 2370/331; B60K 2370/52; B60R 1/00; G02F 1/133305; G02F 1/133388; G02F 1/13452; G02F 1/136254; G02F 2201/50; G02F 2202/28; H01L 2224/73204; Y02E 10/549; G09G 2300/0426

See application file for complete search history.

(56) References Cited

U.S. PATENT DOCUMENTS

2007/0170841 A1 7/2007 Li
2012/0007107 A1 1/2012 Choi
2016/0322444 A1 11/2016 Kang et al.
2017/0062772 A1* 3/2017 Chu ..................... H10K 59/131
2020/0111844 A1* 4/2020 Jing ..................... G06F 3/0443
2022/0140283 A1* 5/2022 Kim ..................... H10K 59/879 257/40
2022/0384767 A1* 12/2022 Luo ..................... H10D 30/6757
2023/0130485 A1* 4/2023 Park ..................... H10K 59/126 257/40

FOREIGN PATENT DOCUMENTS

| | | |
|---|---|---|
| CN | 105810718 | 7/2016 |
| CN | 109301082 | 2/2019 |
| CN | 110289284 | 9/2019 |
| CN | 110323353 | 10/2019 |
| CN | 110910770 | 3/2020 |
| CN | 111025750 | 4/2020 |
| CN | 111354862 | 6/2020 |
| CN | 111755490 | 10/2020 |
| CN | 111965933 | 11/2020 |
| CN | 111969011 | 11/2020 |
| CN | 113345919 | 9/2021 |
| CN | 113555517 | 10/2021 |
| CN | 113644220 | 11/2021 |
| CN | 113659093 | 11/2021 |
| JP | 2000-294380 | 10/2000 |

OTHER PUBLICATIONS

International Search Report and the Written Opinion Dated Dec. 15, 2022 From the International Searching Authority Re. Application No. PCT/CN2022/094355 and Its Translation Into English. (18 Pages).

* cited by examiner

DISPLAY PANEL AND DISPLAY MODULE

RELATED APPLICATIONS

This application is a National Phase of PCT Patent Application No. PCT/CN2022/094355 having International filing date of May 23, 2022, which claims the benefit of priority of Chinese Patent Application No. 202210457934.2 filed on Apr. 27, 2022. The contents of the above applications are all incorporated by reference as if fully set forth herein in their entirety.

FIELD AND BACKGROUND OF THE INVENTION

The present disclosure relates to the field of display technology, and more particularly, to a display panel and a display module.

With a development of display technology, organic light-emitting diodes (OLED) displays have gradually become mainstream. In a multi-layer structure of a conventional flexible OLED display, a polarizer (POL) is mainly configured to prevent external light entering inside an OLED display from being emitted from the OLED display, so as to enhance a contrast ratio of the OLED display. However, while the polarizer enhances the contrast ratio of the OLED display, a thickness of film layers of the polarizer is relatively thick, which greatly increases a difficulty of manufacturing the OLED display that is thin and light. Especially when the OLED display is applied to a flexible display, a multilayer structure makes an overall thickness of the OLED display thicker, and a stress corresponding to a bending region is also greater, thereby causing more obvious creases in the bending region of a flexible OLED display.

Therefore, it is necessary to provide a technical solution to reduce a thickness of the OLED display so as to solve problems mentioned above.

SUMMARY OF THE INVENTION

The present invention provides a display panel and a display module capable of overcoming technical problems of a conventional organic light-emitting diodes (OLED) display having a thicker thickness and having obvious creases in a bending region.

In order to overcome the above-mentioned problems, the present invention provides the following technical solutions:

The present invention provides a display panel including:

a substrate;

a light-emitting device layer disposed on the substrate, wherein the light-emitting device layer includes a plurality of effective light-emitting regions and a non-light-emitting region located outside the plurality of effective light-emitting regions; and a first light absorbing layer disposed on a side of the light-emitting device layer facing a light-emitting side of the display panel.

The first light absorbing layer is disposed corresponding to the non-light-emitting region.

Optionally, in some embodiments of the present invention, the first light absorbing layer is a semiconductor light absorbing material.

Optionally, in some embodiments of the present invention, an orthographic projection of the first light absorbing layer on the light-emitting device layer overlaps with the non-light-emitting region.

Optionally, in some embodiments of the present invention, the light-emitting device layer includes an anode, a light-emitting functional layer, and a cathode that are stacked, the anode is located on a side of the light-emitting functional layer facing the substrate, the cathode is located on a side of the light-emitting functional layer facing away from the substrate.

The first light absorbing layer is disposed on a surface of the cathode facing the light-emitting side.

Optionally, in some embodiments of the present invention, when the light-emitting device layer is a top emission structure, the first light absorbing layer is located on a surface of the cathode facing away from the substrate. When the light-emitting device layer is a bottom emission structure, the first light absorbing layer is located on a surface of a side of the cathode facing the substrate.

Optionally, in some embodiments of the present invention, when the light-emitting device layer is the top emission structure, the display panel further includes a second light absorbing layer, and the second light absorbing layer is located on a surface of a side of the anode facing sway from the substrate and is arranged corresponding to the non-light-emitting region.

Optionally, in some embodiments of the present invention, the anode includes a first portion corresponding to the non-light-emitting region, and the second light absorbing layer covers the first portion of the anode.

Optionally, in some embodiments of the present invention, the second light absorbing layer is a semiconductor light absorbing material.

Optionally, in some embodiments of the present invention, the display panel further includes a touch layer, the touch layer is disposed on a side of the first light absorbing layer facing the light-emitting side, the touch layer includes a touch electrode line and a third light absorbing layer, the touch electrode line is located in the non-light-emitting region, and the third light absorbing layer is located on a surface of a side of the touch electrode line facing away from the light-emitting device layer.

Optionally, in some embodiments of the present invention, an orthographic projection of the third light absorbing layer on the substrate covers an orthographic projection of the touch electrode lines on the substrate.

Optionally, in some embodiments of the present invention, the display panel further includes a touch layer, the touch layer is disposed on a side of the light-emitting device layer facing away from the substrate, the touch layer includes a touch electrode line, and the touch electrode line is located in the non-light-emitting region, wherein the first light absorbing layer is located on a surface of a side of the touch layer facing the light-emitting side.

The present invention further provides a display module including a touch layer and a display panel. The touch layer is disposed on a light-emitting side of the display panel.

The display panel includes a substrate and a light-emitting device layer disposed on the substrate, and the light-emitting device layer includes a plurality of effective light-emitting regions and a non-light-emitting region located outside the plurality of effective light-emitting regions.

The display panel further includes a first light absorbing layer, the first light absorbing layer is disposed on a side of the light-emitting device layer facing the light-emitting side of the display panel, and the first light absorbing layer is arranged corresponding to the non-light-emitting region.

The touch layer includes a touch electrode line and a third light absorbing layer, the touch electrode line is located in the non-light-emitting region, and the third light absorbing layer is located on a surface of a side of the touch electrode line facing away from the display panel.

Optionally, in some embodiments of the present invention, an orthographic projection of the third light absorbing layer on the display panel covers an orthographic projection of the touch electrode line on the display panel.

Optionally, in some embodiments of the present invention, the first light absorbing layer is a semiconductor light absorbing material.

Optionally, in some embodiments of the present invention, an orthographic projection of the first light absorbing layer on the light-emitting device layer overlaps with the non-light-emitting region.

Optionally, in some embodiments of the present invention, the light-emitting device layer includes an anode, a light-emitting functional layer, and a cathode that are stacked, the anode is located on a side of the light-emitting functional layer facing the substrate, the cathode is located on a side of the light-emitting functional layer facing away from the substrate.

The first light absorbing layer is disposed on a surface of the cathode facing the light-emitting side.

Optionally, in some embodiments of the present invention, when the light-emitting device layer is a top emission structure, the first light absorbing layer is located on a surface of the cathode facing away from the substrate. When the light-emitting device layer is a bottom emission structure, the first light absorbing layer is located on a surface of a side of the cathode facing the substrate.

Optionally, in some embodiments of the present invention, when the light-emitting device layer is the top emission structure, the display panel further includes a second light absorbing layer, and the second light absorbing layer is located on a surface of a side of the anode facing sway from the substrate and is arranged corresponding to the non-light-emitting region.

Optionally, in some embodiments of the present invention, the anode includes a first portion corresponding to the non-light-emitting region, and the second light absorbing layer covers the first portion of the anode.

Optionally, in some embodiments of the present invention, the second light absorbing layer is a semiconductor light absorbing material.

The beneficial effects of the present invention are as follows: in the display panel and the display module provided by the present invention, the first light absorbing layer is disposed on the side of the light-emitting device layer facing the light-emitting side, and the first light absorbing layer is covered on the non-light-emitting region of the light-emitting device layer. The first light absorbing layer is configured for absorbing ambient light reflected by metal electrodes in the non-light-emitting region, which can replace a structure of a conventional polarizer, and the first light absorbing layer is manufactured to be inside the display panel, thereby achieving a thinning of the display panel. When the display panel is applied to a flexible display, a problem of creases in the bending region of the display panel can also be reduced.

BRIEF DESCRIPTION OF THE SEVERAL VIEWS OF THE DRAWINGS

In order to describe technical solutions in the present invention clearly, drawings to be used in the description of embodiments will be described briefly below. Obviously, drawings described below are only for some embodiments of the present invention, and other drawings can be obtained by those skilled in the art based on these drawings without creative efforts.

In order to describe technical solutions in the present invention clearly, drawings to be used in the description of embodiments will be described briefly below. Obviously, drawings described below are only for some embodiments of the present invention, and other drawings can be obtained by those skilled in the art based on these drawings without creative efforts.

DESCRIPTION OF SPECIFIC EMBODIMENTS OF THE INVENTION

Figure 1:
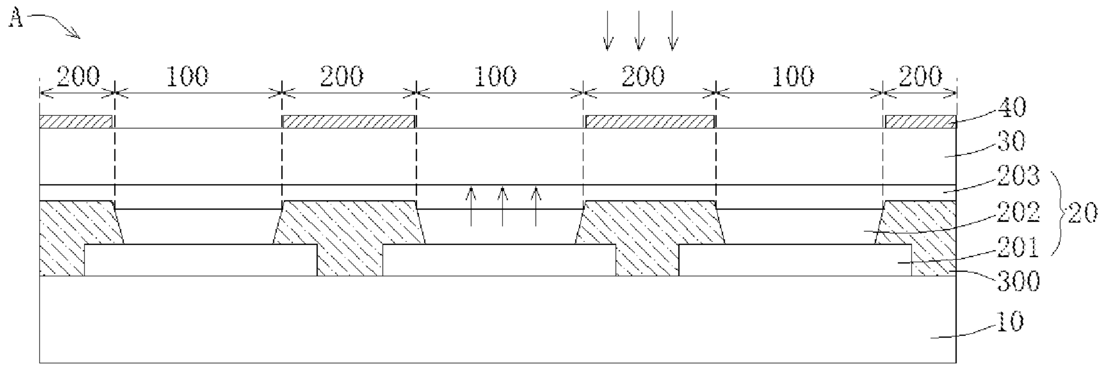
FIG. 1 is a cross-sectional schematic view of a display panel provided by a first embodiment of the present invention.

The technical solution of the present invention embodiment will be clarified and completely described with reference accompanying drawings in embodiments of the present invention embodiment. Obviously, the present invention described parts of embodiments instead of all of the embodiments. Based on the embodiments of the present invention, other embodiments which can be obtained by a skilled in the art without creative efforts fall into the protected scope of the present invention. In addition, it should be understood that specific implementations described here are only used to illustrate and explain the present invention and are not used to limit the present invention. In the present invention, if no explanation is made to the contrary, orientation words such as “upper” and “lower” usually refer to upper and lower directions of a device in an actual use or a working state and specifically refer to drawing directions in drawings. Also, “inner” and “outer” refer to an outline of the device.

Referring to FIGS. 1-8, an embodiment of the present invention provides a display panel, which includes a substrate 10 and a light-emitting device layer 20, and the light-emitting device layer 20 is disposed on the substrate 10. The substrate 10 is provided with a driving circuit, the light-emitting device layer 20 is electrically connected to the driving circuit, and the light-emitting device layer 20 emits light in response to a driving signal provided by the driving circuit. The light-emitting device layer 20 includes a plurality of effective light-emitting regions 100 and a non-light-emitting region 200 located outside the plurality of effective light-emitting regions 100.

The display panel includes a light-emitting side A (i.e., a light-emitting surface), and the display panel further includes a first light absorbing layer 40, and the first light absorbing layer 40 is disposed on a side of the light-emitting device layer 20 facing the light-emitting side A, and the first light absorbing layer 40 is disposed corresponding to the non-light-emitting region 200.

Generally speaking, a variety of metal electrodes/signal lines with different functions are arranged on the display panel, and these metal electrodes/signal lines have properties of reflecting light. After entering the display panel, an ambient light is reflected by these metal electrodes/signal lines and then emitted from the display panel, thereby reducing a contrast ratio of a display of the display panel, and affecting a display effect. In a conventional design, a polarizer is usually adopted to prevent the ambient light entering inside the display panel from being emitted. In an embodiment of the present invention, through disposing the first light absorbing layer 40 on the side of the light-emitting device layer 20 facing the light-emitting side A, and disposing the first light absorbing layer 40 in the non-light-emitting region 200 of the light-emitting device layer 20, the first light absorbing layer 40 can absorb the ambient light emitted to the metal electrodes/signal lines of the non-light-emitting region 200, thereby replacing a structure of a conventional polarizer. In addition, the first light absorbing layer 40 in an embodiment of the present invention is manufactured to be inside the display panel, so as to achieve thinning of the display panel. In addition, when the display panel of an embodiment of the present invention is applied to a flexible display, since an overall thickness is relatively thin, a stress on a bending region of the display panel can be reduced, and thus a problem of creases in the bending region of the display panel can also be reduced.

References are made to the following embodiments for details. It should be noted that a description order of the following embodiments is not intended to limit a preferred order of the embodiments.

Figure 2:
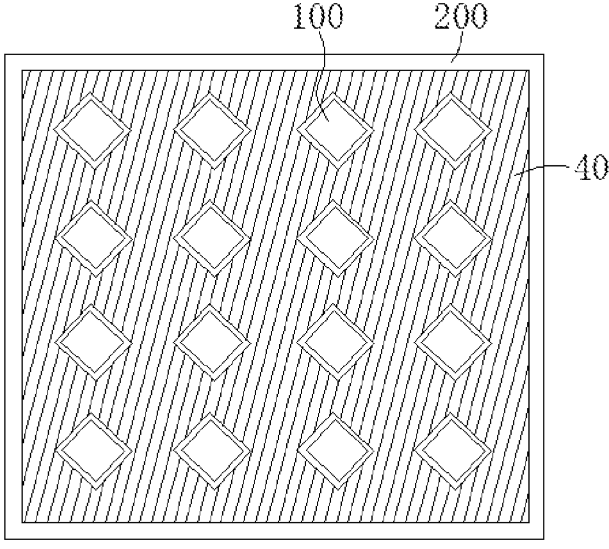
FIG. 2 is a schematic view of a coating region of a first light absorbing layer in FIG. 1.

Referring to FIGS. 1-2, FIG. 1 is a cross-sectional schematic view of a display panel provided by a first embodiment of the present invention, and FIG. 2 is a schematic view of a coating region of a first light absorbing layer in FIG. 1. Solutions of this embodiment is described in detail below.

As shown in FIG. 1, this embodiment provides a display panel including a substrate 10, a light-emitting device layer 20, a thin-film encapsulation layer 30, and a first light absorbing layer 40. The light-emitting device layer 20 is disposed on the substrate 10, the thin-film encapsulation layer 30 is disposed on the light-emitting device layer 20, and the first light absorbing layer 40 is disposed on a side of the light-emitting device layer 20 facing a light-emitting side A of the display panel. Specifically, the first light absorbing layer 40 in this embodiment is disposed on a surface of a side of the thin-film encapsulation layer 30 facing away from the substrate 10.

The substrate 10 includes a first substrate (not shown) and an array driving layer (not shown) located on the first substrate, i.e., the substrate 10 can be an array substrate. The first substrate can be a rigid substrate or a flexible substrate. The array driving layer includes a plurality of inorganic film layers and a plurality of thin-film transistors arranged in an array. Each of the thin-film transistors can include a semiconductor layer, a gate, a source, and a drain. The plurality of thin-film transistors are formed through a top-gate method in which the gate is located above the semiconductor layer, but is not limited to this method. For example, the plurality of thin-film transistors are formed through a bottom-gate method in which the gate is located under the semiconductor layer, or a double-gate method in which the gate is located above and below the semiconductor layer.

The plurality of inorganic film layers can include a buffer film, an insulating interlayer, and a gate insulating film. The buffer film can be disposed between the first substrate and the semiconductor layer. The insulating interlayer can be disposed on the semiconductor layer, the gate can be disposed on the insulating interlayer, and the gate insulating film can be disposed on the gate. Furthermore, the source and the drain can be disposed on the gate insulating film, and each of the source and the drain can be connected to the semiconductor layer via a contact hole penetrating the insulating interlayer and the gate insulating film.

The light-emitting device layer 20 is electrically connected to a driving circuit in the array driving layer on the substrate 10, the driving circuit is configured for providing a driving signal for the light-emitting device layer 20, and the light-emitting device layer 20 emits light in respond to the driving signal. As shown in FIG. 2, the light-emitting device layer 20 includes a plurality of effective light-emitting regions 100 and a non-light-emitting region 200 located outside the plurality of effective light-emitting regions 100. The first light absorbing layer 40 is disposed corresponding to the non-light-emitting region 200. Specifically, an orthographic projection of the first light absorbing layer 40 on the light-emitting device layer 20 overlaps with the non-light-emitting region 200.

That is to say, the first light absorbing layer 40 completely covers a corresponding region of the non-light-emitting region 200, and does not overlap with the plurality of effective light-emitting regions 100, so that the ambient light incident from outside to the non-light-emitting region 200 can mostly be absorbed without affecting a normal display.

Referring further to FIG. 1, the light-emitting device layer 20 in this embodiment is a top emission structure. The light-emitting device layer 20 includes an anode 201, a light-emitting functional layer 202, and a cathode 203 that are stacked. The anode 201 is located on a side of the light-emitting functional layer 202 facing the substrate 10, and the cathode 203 is located on a side of the light-emitting functional layer 202 facing away from the substrate 10. Each anode 201 is electrically connected to a corresponding drain. Each two adjacent light-emitting functional layers 202 are separated by a pixel definition layer 300. Each light-emitting functional layer 202 can include a hole injection layer, a hole transport layer, a light-emitting layer, an electron transport layer, and an electron injection layer. In this case, if a voltage is applied to the anode 201 and the cathode 203, holes in the hole injection layer and electrons in the electron injection layer are transported to the light-emitting layer through the hole transport layer and the electron transport layer and are combined in the light-emitting layer to emit light. It can be understood that the plurality of effective light-emitting regions 100 are the light-emitting region of the light-emitting functional layer 202.

The light-emitting functional layer 202 can include a red light-emitting layer for emitting red light, a green light-emitting layer for emitting green light, and a blue light-emitting layer for emitting blue light.

The thin-film encapsulation layer 30 prevents oxygen or moisture from penetrating into the light-emitting functional layer 202. Therefore, the thin-film encapsulation layer 30 can include a first inorganic film, an organic film, and a second inorganic film that are stacked.

In this embodiment, the material of the first light absorbing layer 40 can be a semiconductor light absorbing material, such as cadmium selenide (CdSe).

A principle of light absorbing of the semiconductor light absorbing materials is: Since different materials have different molecular compositions and structures, they have different characteristic energy levels and different energy level differences, and each material can only absorb light radiation equivalent to the energy level difference inside molecule thereof, so that absorption of light waves by the different materials is selective. An absorption boundary of the solid material is $\Delta$=1240/band gap Eg. For example: adopting CdSe, having Eg=1.7 eV and an absorption boundary of 729 nm, which can substantially achieve an absorption of all visible lights.

In this embodiment, the first light absorbing layer 40 is disposed on the surface of the thin-film encapsulation layer 30 of the display panel facing away from the substrate 10, and the first light absorbing layer 40 is disposed corresponding to the non-light-emitting region 200, so as to absorb the ambient light incident to the metal electrodes/signal lines of the non-light-emitting region 200, thereby replacing the structure of the conventional polarizer. The first light absorbing layer 40 of this embodiment is manufactured on a surface of the thin-film encapsulation layer 30, having a thickness much smaller than a thickness of the polarizer, and only a thin layer of coating is sufficient, thereby achieving the thinning of the display panel. In addition, when the display panel is applied to a flexible display, a stress on a bending region of the display panel can be reduced, and thus the problem of the creases in the bending region of the display panel can also be reduced.

Furthermore, according to the light-emitting functional layer 202 including the red light-emitting layer, the green light-emitting layer, and the blue light-emitting layer, the display panel can also be provided with a corresponding color filter (not shown) on the side of the light-emitting device layer 20 facing the light-emitting side A, and the color filter is disposed corresponding to the plurality of effective light-emitting regions 100. Color filters corresponding to light-emitting layers of different colors can absorb light having a predetermined wavelength of visible lights, that is, the color filters corresponding to the light-emitting layers of the different colors can have different light absorbing wavelength ranges and light transmission wavelength ranges.

For example, a donor material for a red color filter can have a wavelength range that absorbs light other than red light, i.e., the donor material for the red color filter can have the wavelength range that transmits red light. Furthermore, a donor material for a green color filter can have a wavelength range that absorbs light other than green light, i.e., the donor material for the green color filter can have the wavelength range that transmits green light. Furthermore, a donor material for a blue color filter can have a wavelength range that absorbs light other than blue light, i.e., the donor material for the blue color filter can have the wavelength range that transmits blue light.

In addition, the red color filter, the green color filter, and the blue color filter can absorb the ambient light from outside. In this way, the ambient light incident into the display panel can be prevented from being reflected from the plurality of effective light-emitting regions 100 and emitted from the display panel which affects the contrast ratio. In addition, attaching the polarizer to reduce a reflection of the ambient light is not required.

Figure 3:
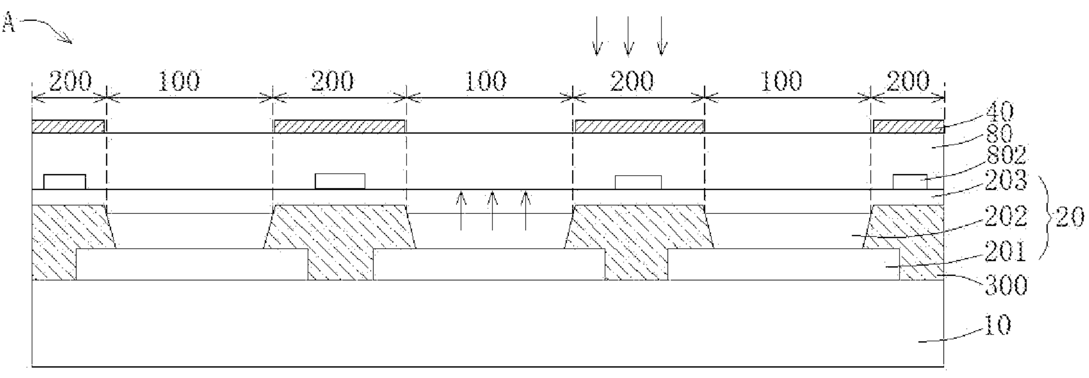
FIG. 3 is a cross-sectional schematic view of a display panel provided by a second embodiment of the present invention.

Reference is made to FIG. 3. FIG. 3 is a cross-sectional schematic view of a display panel provided by a second embodiment of the present invention. A structure of the display panel of this embodiment is similar to a structure of the display panel of the first embodiment mentioned above, and a difference only lies in that the display panel of this embodiment further includes a touch layer 80. That is to say, the display panel of this embodiment is an in-cell touch display panel, the touch layer 80 is disposed on a side of the light-emitting device layer 20 facing away from the substrate 10, the touch layer 80 includes a touch electrode line 802, the touch electrode line 802 is located in the non-light-emitting region 200, and the first light absorbing layer 40 is located on a surface of the touch layer 80 facing the light-emitting side A.

Furthermore, the orthographic projection of the first light absorbing layer 40 on the light-emitting device layer 20 overlaps with the non-light-emitting region 200, so that the first light absorbing layer 40 can completely cover the corresponding region of the non-light-emitting region 200 and does not overlap with the plurality of effective light-emitting regions 100.

The first light absorbing layer 40 of this embodiment is disposed above the touch electrode lines 802. Therefore, in this embodiment, the ambient light incident to the touch electrode line 802 can also be absorb on a basis of the first embodiment mentioned above, so as to prevent the touch electrode line from reflecting the ambient light and affecting the display effect and prevent the touch electrode line from a problem of being visible.

Figure 4:
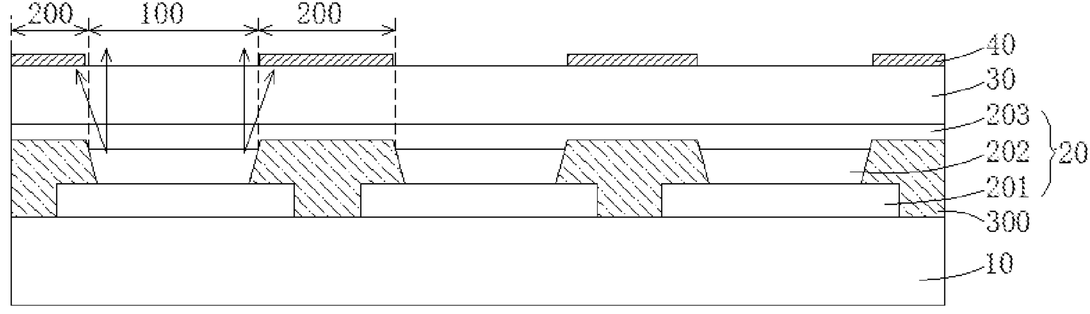
FIG. 4 is a cross-sectional schematic view illustrating a light-emitting device layer of the display panel when emitting light in FIG. 1.

While achieving a purpose in the above, technical solutions of the first embodiment and the second embodiment mentioned above also have a common problem, that is, how can a pixel aperture ratio be considered. The display panel of the first embodiment is taken as an example for description. Reference is made to FIG. 4. FIG. 4 is a cross-sectional schematic view illustrating a light-emitting device layer of the display panel when emitting light in FIG. 1. Since the first light absorbing layer 40 on the display panel of the first embodiment mentioned above is farther away from the light-emitting functional layer 202, light emitted by the light-emitting functional layer 202 is required to pass through other film layers above the film layer to be emitted from the display panel. In this process, the light emitted by the light-emitting functional layer 202 toward an edge of the non-light-emitting region 200 is absorbed by the first light absorbing layer 40, so that the light emitted by the light-emitting functional layer 202 can only be emitted from the plurality of effective light-emitting regions 100. Therefore, while achieving a lightening and the thinning of the display panel, a viewing angle of the display panel is also affected, and an aperture ratio of the display panel is also affected.

Therefore, the present invention provides the following embodiments to effectively solve this problem. References are made to the following embodiments for details.

Figure 5:
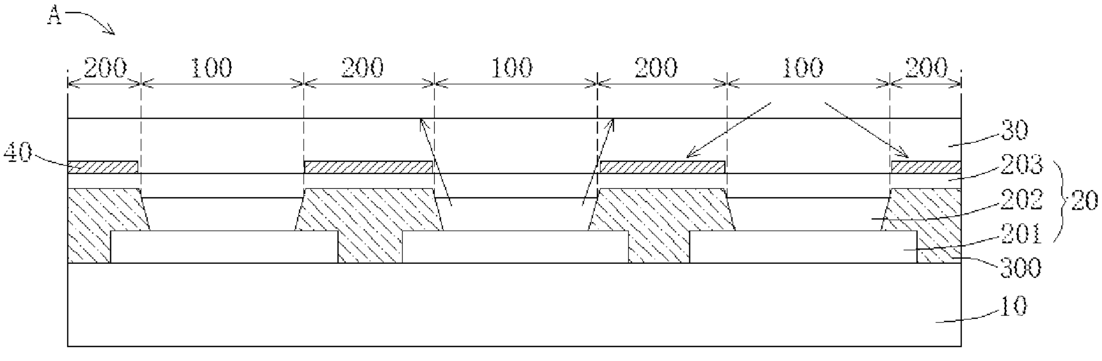
FIG. 5 is a cross-sectional schematic view of a display panel provided by a third embodiment of the present invention.

Reference is made to FIG. 5. FIG. 5 is a cross-sectional schematic view of a display panel provided by a third embodiment of the present invention. This embodiment is described by taking the light-emitting device layer 20 as an example of a top emission structure. A structure of the display panel of this embodiment is similar to the structure of the first embodiment mentioned above, a difference only lies in that the first light absorbing layer 40 of this embodiment is not disposed on the surface of the thin-film encapsulation layer 30, and the first light absorbing layer 40 is disposed on a surface of a side of the cathode 203 facing the light-emitting side A. That is, the first light absorbing layer 40 is located on the surface of the side of the cathode 203 facing away from the substrate 10.

In this embodiment, the first light absorbing layer 40 is directly disposed on the surface of the side of the cathode 203 facing away from the substrate 10, so that a distance between the first light absorbing layer 40 and the light-emitting functional layer 202 is relatively small. The light emitted by the light-emitting functional layer 202 toward the edge of the non-light-emitting region 200 can be emitted from the display panel through a corresponding portion of the non-light-emitting region 200, as shown by arrows in the figures, so as not to affect the viewing angle of the display panel, and also enhances the aperture ratio of the display panel. In addition, the first light absorbing layer 40 is configured for absorbing the ambient light emitted to the metal electrodes/signal lines of the non-light-emitting region 200, thereby replacing the structure of the conventional polarizer. In addition, the first light absorbing layer 40 in this embodiment is manufactured to be inside the display panel, having the thickness much smaller than the thickness of the polarizer, thereby achieving the lightening and the thinning of the display panel.

Figure 9:
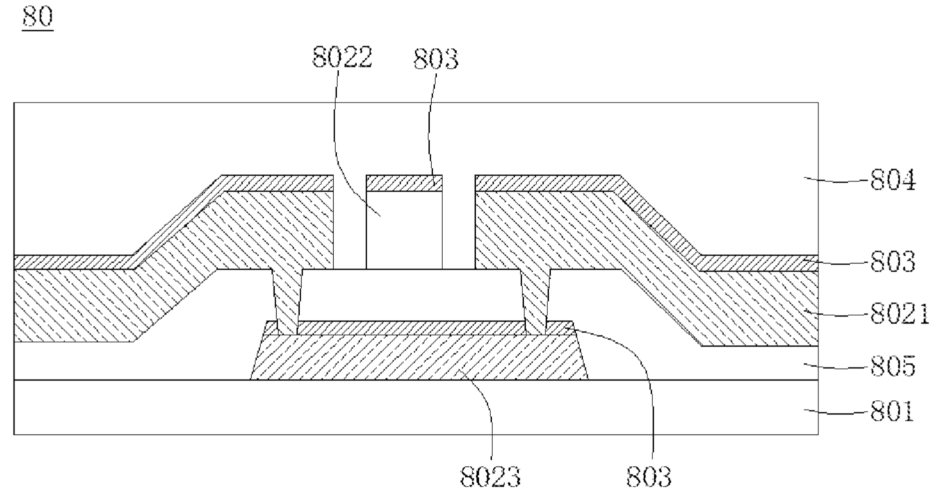
FIG. 9 is a cross-sectional schematic view of a touch layer of the display panel in FIG. 8.

Referring to FIG. 5 and FIG. 9, in another embodiment, the display panel can be an in-cell touch display panel. That is to say, the touch layer 80 is provided between the light-emitting device layer 20 and the thin-film encapsulation layer 30 of the display panel, and the touch layer 80 can adopt a self-capacitive touch control or a mutual capacitive touch control. Reference is made to FIG. 9 for details. The touch layer 80 is disposed on the side of the first light absorbing layer 40 facing the light-emitting side A. The touch layer 80 includes a first buffer layer 801, a conductive bridge 8023, a dielectric layer 805, a first touch electrode line 8021, a second touch electrode line 8022, a planarization layer 804, and a third light absorbing layer 803. The first touch electrode line 8021 and the second touch electrode line 8022 form a mesh structure, two adjacent first touch electrode lines 8021 are electrically connected through the conductive bridge 8023, and two adjacent second touch electrode lines 8022 are directly electrically connected through materials of their own.

Materials of the first touch electrode line 8021, the second touch electrode line 8022, and the conductive bridge 8023 can be metal materials.

The first touch electrode line 8021, the second touch electrode line 8022, and the conductive bridge 8023 are all located in the non-light-emitting region 200, and the third light absorbing layer 803 is respectively located on a surface of a side of the first touch electrode line 8021, a surface of a side of the second touch electrode line 8022, and a surface of a side of the conductive bridge 8023 that are facing away from the light-emitting device layer 20.

Furthermore, an orthographic projection of the third light absorbing layer 803 on the substrate 10 covers orthographic projections of the first touch electrode line 8021, the second touch electrode line 8022, and the conductive bridge 8023 on the substrate 10.

A material of the third light absorbing layer 803 is same as a material of the first light absorbing layer 40.

In this embodiment, the third light absorbing layer 803 is disposed on the surface of the side of the first touch electrode line 8021, the surface of the side of the second touch electrode line 8022, and the surface of the side of the conductive bridge 8023 that are facing away from the substrate 10, and the third light absorbing layer 803 can absorb the ambient light emitted from outside to the first touch electrode line 8021, the second touch electrode line 8022, and the conductive bridge 8023 to prevent the ambient light from being emitted and reflected on metal electrodes of the touch layer 80 which affects the display effect, and can also solve a problem of the first touch electrode line 8021, the second touch electrode line 8022, and the conductive bridge 8023 being visible due to an omission of the polarizer. In addition, since the third light absorbing layer 803 is located on the surface of the side of the first touch electrode line 8021, the surface of the side of the second touch electrode line 8022, and the surface of the side of the conductive bridge 8023 that are facing away from the substrate 10, instead of covering an entire non-light-emitting region 200, the aperture ratio and a viewing angle for display are not affected.

Figure 6:
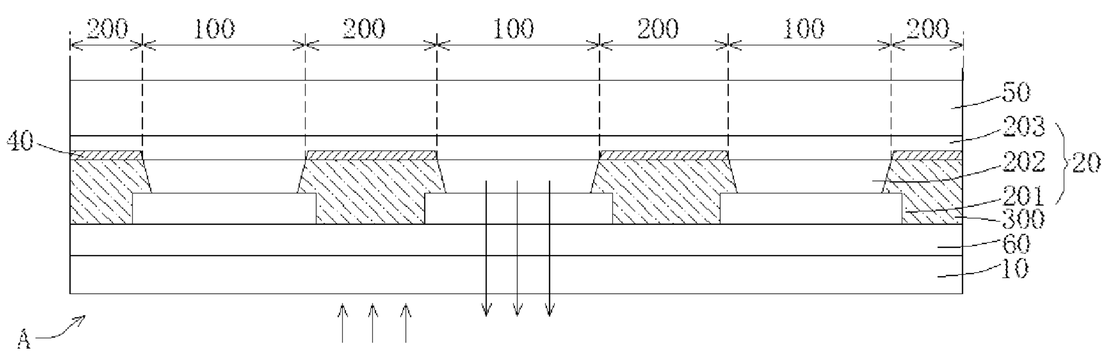
FIG. 6 is a cross-sectional schematic view of a display panel provided by a fourth embodiment of the present invention.

Reference is made to FIG. 6. FIG. 6 is a cross-sectional schematic view of a display panel provided by a fourth embodiment of the present invention. This embodiment is described by taking the light-emitting device layer 20 as an example of a bottom emission structure. The display panel includes the substrate 10, a color filter layer 60, the light-emitting device layer 20, the first light absorbing layer 40, and an opposite substrate 50. The color filter layer 60 is located on the substrate 10, the light-emitting device layer 20 is located on a side of the color filter layer 60 facing away from the substrate 10, and the opposite substrate 50 is located on the side of the light-emitting device layer 20 facing away from the substrate 10. The light-emitting side A of the display panel is a side of the display panel having the substrate 10. The light-emitting device layer 20 includes the plurality of effective light-emitting regions 100 and the non-light-emitting region 200. The first light absorbing layer 40 is disposed on the side of the light-emitting device layer 20 facing the light-emitting side A of the display panel, and disposed corresponding to the non-light-emitting region 200.

A structure of the substrate 10 is same as a structure of the substrate of the display panel in the first embodiment mentioned above. It should be noted that the first substrate on the substrate 10 in this embodiment is a transparent glass substrate, or a transparent substrate made of other materials.

A structure of the light-emitting device layer 20 in this embodiment is similar to a structure of the light-emitting device layer of the display panel in the first embodiment mentioned above. That is to say, the light-emitting device layer 20 includes the anode 201, the light-emitting functional layer 202, and the cathode 203 that are stacked. A difference only lies in that the light-emitting device layer 20 in this embodiment has the bottom emission structure. In addition, the opposite substrate 50 can be a glass substrate or a substrate made of other materials, which is not limited herein.

In this embodiment, the color filter layer 60 includes a plurality of color filters corresponding to the red light-emitting layer, the green light-emitting layer, and the blue light-emitting layer of the light-emitting functional layer 202, and the plurality of color filters are arranged corresponding to the plurality of effective light-emitting region 100 as described above. It should be noted that, a structure of the color filter layer 60 in the figure is only exemplarily, and is not limited thereto. Functions of the color filter layer 60 in this embodiment is same as functions of the color filters in the first embodiment, and are not reiterated herein.

In this embodiment, the first light absorbing layer 40 is directly disposed on the surface of the side of the cathode 203 facing the substrate 10, so that the first light absorbing layer 40 does not affect the viewing angle of the display panel, and also enhances the aperture ratio of the display panel. In addition, since the light-emitting device layer 20 is the bottom emission structure, the cathode 203 is a reflective electrode, the anode 201 is a transparent electrode, and the first light absorbing layer 40 on the surface of the cathode 203 is configured for absorbing the ambient light emitting to the corresponding portion of the cathode 203 of the non-light-emitting region 200, thereby replacing the structure of the conventional polarizer, and achieving the thinning of the display panel.

It can be understood that, in other embodiments, the first light absorbing layer 40 can also be located in other film layers of the light-emitting device layer 20 facing the light-emitting side A, e.g., the first light absorbing layer 40 can also be disposed on the surface of the side of the anode 201 facing the substrate 10 in addition to be located on the surface of the side of the cathode 203 facing the substrate 10, which is not limited herein.

Figure 7:
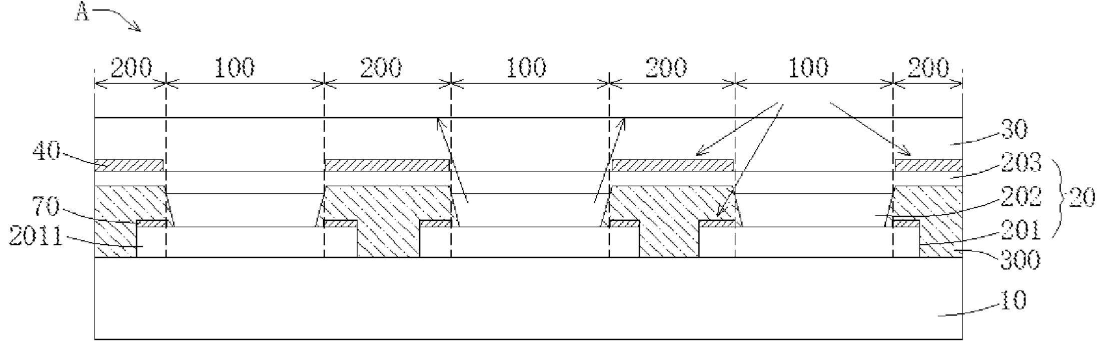
FIG. 7 is a cross-sectional schematic view of a display panel provided by a fifth embodiment of the present invention.

Reference is made to FIG. 7. FIG. 7 is a cross-sectional schematic view of a display panel provided by a fifth embodiment of the present invention. This embodiment is described by taking the light-emitting device layer 20 as an example of the top emission structure. It should be noted that a structure of the display panel of this embodiment is similar to a structure of the display panel of the second embodiment mentioned above, and a difference only lies in that the display panel of this embodiment further includes a second light absorbing layer 70, and the second light absorbing layer 70 is located on a surface of a side of the anode 201 facing away from the substrate 10, and disposed corresponding to the non-light-emitting region 200.

Specifically, an area of the anode 201 is generally larger than an area of the light-emitting functional layer 202. The anode 201 includes a first portion 2011 corresponding to the non-light-emitting region 200, and the second light absorbing layer 70 is located on a surface of a side of the first portion 2011 facing away from the substrate 10, and the second light absorbing layer 70 covers the first portion 2011. A material of the second light absorbing layer 70 is same as the material of the first light absorbing layer 40.

Since the light-emitting device layer 20 has the top emission structure, the anode 201 is a reflective electrode, so as to reflect the light emitted by the light-emitting functional layer 202 toward the anode 201 from the display panel, and enhance a utilization rate of light emitted by the light-emitting functional layer 202. Generally, the pixel definition layer 300 is made of polyimide material. Since the polyimide material has a certain transmittance, a portion of the ambient light incident inside the display panel is reflected in the first portion 2011, which affects a visual effect of the display panel.

In this embodiment, on a basis of the second embodiment above, the second light absorbing layer 70 is disposed on a surface of a side of the first portion 2011 of the anode 201 facing away from the substrate 10. The second light absorbing layer 70 is configured for absorbing the ambient light emitted to the first portion 2011 of the anode 201 through the plurality of effective light-emitting regions 100. The first light absorbing layer 40 and the second light absorbing layer 70 in this embodiment are both disposed inside the display panel, which can replace the structure of the conventional polarizer, achieve the lightening and the thinning of the display panel, and also enhance the aperture ratio.

Figure 8:
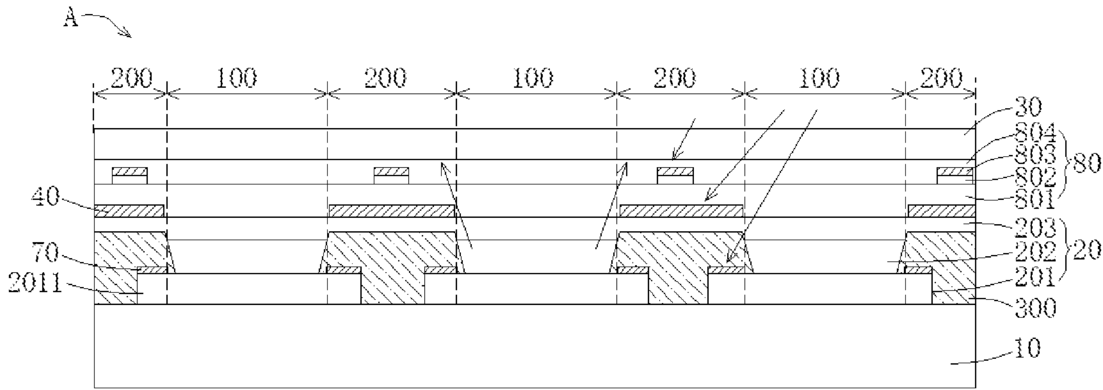
FIG. 8 is a cross-sectional schematic view of a display panel provided by a sixth embodiment of the present invention.

Reference is made to FIG. 8. FIG. 8 is a cross-sectional schematic view of a display panel provided by a sixth embodiment of the present invention. The display panel of this embodiment can be of a bottom emission type or a top emission type. Here, the top emission type is taken as an example for description. It should be noted that a structure of the display panel of this embodiment is similar to a structure of the fourth embodiment mentioned above, and a difference only lies in that the display panel of this embodiment is an in-cell touch display panel. That is to say, the touch layer 80 is disposed between the light-emitting device layer 20 and the film encapsulation layer 30 of the display panel, and the touch layer 80 is disposed on the side of the first light absorbing layer 40 facing the light-emitting side A. The touch layer 80 includes the first buffer layer 801, the touch electrode line 802, the third light absorbing layer 803, and the planarization layer 804. The first buffer layer 801 is located on a side of the first light absorbing layer 40 facing away from the substrate 10. The touch electrode line 802 is located on a side of the first buffer layer 801 facing away from the substrate 10. The third light absorbing layer 803 is located on a side of the touch electrode line 802 facing away from the substrate 10. The planarization layer 804 covers the third light absorbing layer 803 and the touch control electrode line 802.

The touch electrode line 802 is located in the non-light-emitting region 200, and the third light absorbing layer 803 is located on a surface of a side of the touch electrode line 802 facing away from the light-emitting device layer 20.

Furthermore, an orthographic projection of the third light absorbing layer 803 on the substrate 10 covers an orthographic projection of the touch electrode line 802 on the substrate 10.

In an embodiment, the material of the third light absorbing layer 803 is same as the material of the first light absorbing layer 40 and the material of the second light absorbing layer 70.

Reference is made to FIG. 9. FIG. 9 is a cross-sectional schematic view of a touch layer of the display panel in FIG. 8. The display panel of this embodiment can adopt a self-capacitive touch control or a mutual capacitive touch control. The mutual capacitive touch control is illustrated in FIG. 8. Specifically, the touch layer 80 includes the first buffer layer 801, the conductive bridge 8023, the dielectric layer 805, the first touch electrode line 8021, the second touch electrode line 8022, the planarization layer 804, and the third light absorbing layer 803. The first touch electrode line 8021 and the second touch electrode line 8022 form the mesh structure, the two adjacent first touch electrode lines 8021 are electrically connected through the conductive bridge 8023, and the two adjacent second touch electrode lines 8022 are directly electrically connected through the materials of their own.

Materials of the first touch electrode line 8021, the second touch electrode line 8022, and the conductive bridge 8023 can be metal materials, i.e., the metal materials can include a single layer or a multi-layer made of at least one metal selected from aluminum (Al), platinum (Pt), Palladium (Pd), Silver (Ag), Magnesium (Mg), Gold (Au), Nickel (Ni), Neodymium (Nd), Iridium (Ir), Chromium (Cr), Lithium (Li), Calcium (Ca), molybdenum (Mo), titanium (Ti), tungsten (W), or copper (Cu).

In this embodiment, the third light absorbing layer 803 is disposed on the surface of the side of the first touch electrode line 8021, the surface of the side of the second touch electrode line 8022, and the surface of the side of the conductive bridge 8023 that are facing away from the substrate 10, and the third light absorbing layer 803 can absorb the ambient light emitted from outside to the first touch electrode line 8021, the second touch electrode line 8022, and the conductive bridge 8023 to prevent the ambient light from being emitted and reflected on metal electrodes of the touch layer 80 which affects the display effect. In addition, since the third light absorbing layer 803 is located on the surface of the side of the first touch electrode line 8021, the surface of the side of the second touch electrode line 8022, and the surface of the side of the conductive bridge 8023 that are facing away from the substrate 10. Therefore, the aperture ratio and a viewing angle for display are not affected.

Figure 10:
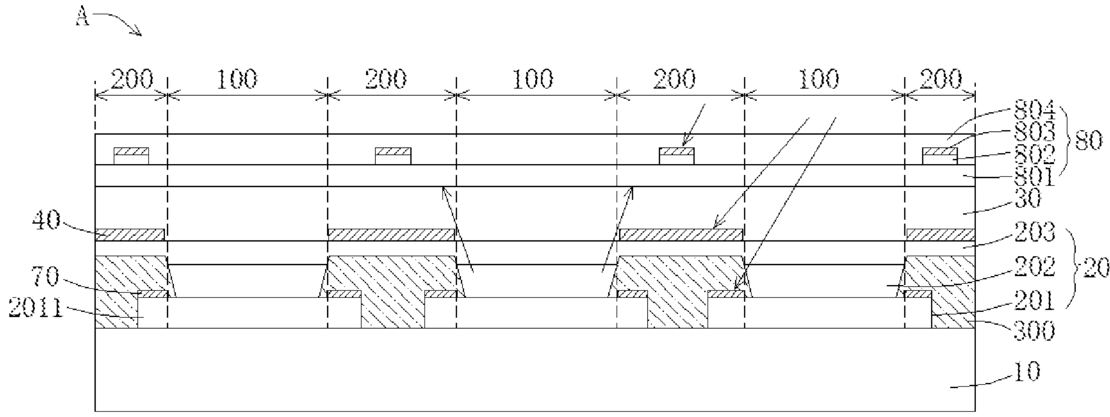
FIG. 10 is a cross-sectional schematic view of a display module provided by an embodiment of the present invention.

Reference is made to FIG. 10. FIG. 10 is a cross-sectional schematic view of a display module provided by an embodiment of the present invention. The display module includes the touch layer 80 and the display panel according to any one of the first to fourth embodiments mentioned above. The display panel of this embodiment can be of the bottom emission type or the top emission type. The top emission type is described as an example. It should be noted that the display module of this embodiment is an additional type, and the touch layer 80 is disposed on the light-emitting side of the display panel. A structure of the touch layer 80 in this embodiment is same as the touch layer in the fifth embodiment. The touch layer 80 includes the first buffer layer 801, the touch electrode line 802, the third light absorbing layer 803, and the planarization layer 804. Reference is made to FIG. 8 for details, and will not be reiterated herein.

The third light absorbing layer 803 is located on a surface of a side of the touch electrode line 802 facing away from the display panel.

Furthermore, an orthographic projection of the third light absorbing layer 803 on the display panel covers an orthographic projection of the touch electrode line 802 on the display panel.

Figure 11:
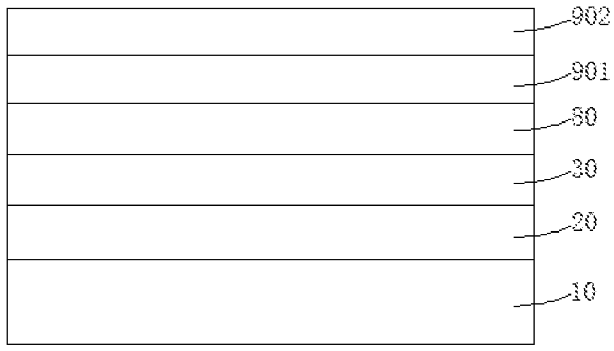
FIG. 11 is a schematic structural view of the display module provided by an embodiment of the present invention.

Reference is made to FIG. 11. FIG. 11 is a schematic structural view of the display module provided by an embodiment of the present invention. The display module sequentially includes the substrate 10, the light-emitting device layer 20, the thin-film encapsulation layer 30, the touch layer 80, an adhesive layer 901, and a protective cover 902 from bottom to top. The substrate 10 can include a copper-graphite composite layer, a metal support layer, a foam layer, a backboard, and a flexible substrate that are disposed in a stack, and two adjacent film layers are bonded by an adhesive layer.

Since the structure of the conventional polarizer is omitted in the present invention, the thickness of the display module is greatly reduced, and the lightening and the thinning of the display module is achieved. When the display module is applied to the flexible display, the problem of the creases in the bending region of the display panel can also be reduced.

The embodiments of the present invention is described in detail above, the specific examples of this document are used to explain principles and embodiments of the present invention, and the description of embodiments above is only for helping to understand the present invention. Meanwhile, those skilled in the art will be able to change the specific embodiments and the scope of the present invention according to the idea of the present invention. In the above, the content of the specification should not be construed as limiting the present invention. Above all, the content of the specification should not be the limitation of the present invention.

What is claimed is:

1. A display panel, comprising:

a substrate;

a light-emitting device layer disposed on the substrate, wherein the light-emitting device layer comprises a plurality of effective light-emitting regions and a non-light-emitting region located outside the plurality of effective light-emitting regions;

a first light absorbing layer disposed on a side of the light-emitting device layer facing a light-emitting side of the display panel; and a pixel definition layer disposed between the substrate and the light-emitting device layer;

wherein the first light absorbing layer is disposed corresponding to the non-light-emitting region;

wherein each of the plurality of effective light-emitting regions comprises a light-emitting functional layer, and each two adjacent ones of the light-emitting functional layers are separated by the pixel definition layer;

wherein the light-emitting device layer comprises an anode, the light-emitting functional layer, and a cathode that are stacked, the anode is located on a side of the light-emitting functional layer facing the substrate, the cathode is located on a side of the light-emitting functional layer facing away from the substrate; and wherein the first light absorbing layer is disposed on a surface of the cathode facing the light-emitting side.

2. The display panel according to claim 1, wherein the first light absorbing layer is a semiconductor light absorbing material.

3. The display panel according to claim 1, wherein an orthographic projection of the first light absorbing layer on the light-emitting device layer overlaps with the non-light-emitting region.

4. The display panel according to claim 1, wherein when the light-emitting device layer is a top emission structure, the first light absorbing layer is located on a surface of the cathode facing away from the substrate.

5. The display panel according to claim 4, wherein the display panel further comprises a touch layer, the touch layer is disposed on a side of the first light absorbing layer facing the light-emitting side, the touch layer comprises a touch electrode line and a third light absorbing layer, the touch electrode line is located in the non-light-emitting region, and the third light absorbing layer is located on a surface of a side of the touch electrode line facing away from the light-emitting device layer.

6. The display panel according to claim 5, wherein an orthographic projection of the third light absorbing layer on the substrate covers an orthographic projection of the touch electrode lines on the substrate.

7. The display panel according to claim 1, wherein the display panel further comprises a touch layer, the touch layer is disposed on a side of the light-emitting device layer facing away from the substrate, the touch layer comprises a touch electrode line, and the touch electrode line is located in the non-light-emitting region, wherein the first light absorbing layer is located on a surface of a side of the touch layer facing the light-emitting side.

8. A display module comprising a touch layer and a display panel, wherein the touch layer is disposed on a light-emitting side of the display panel;

the display panel comprises a substrate, a light-emitting device layer disposed on the substrate, and a pixel definition layer disposed between the substrate and the light-emitting device layer, and the light-emitting device layer comprises a plurality of effective light-emitting regions and a non-light-emitting region located outside the plurality of effective light-emitting regions;

the display panel further comprises a first light absorbing layer, the first light absorbing layer is disposed on a side of the light-emitting device layer facing the light-emitting side of the display panel, and the first light absorbing layer is arranged corresponding to the non-light-emitting region;

the touch layer comprises a touch electrode line and a third light absorbing layer, the touch electrode line is located in the non-light-emitting region, and the third light absorbing layer is located on a surface of a side of the touch electrode line facing away from the substrate;

wherein each of the plurality of effective light-emitting regions comprises a light-emitting functional layer, and each two adjacent ones of the light-emitting functional layers are separated by the pixel definition layer.

9. The display module according to claim 8, wherein an orthographic projection of the third light absorbing layer on the display panel covers an orthographic projection of the touch electrode line on the display panel.

10. The display module according to claim 8, wherein the first light absorbing layer is a semiconductor light absorbing material.

11. The display module according to claim 8, wherein an orthographic projection of the first light absorbing layer on the light-emitting device layer overlaps with the non-light-emitting region.

12. The display module according to claim 8, wherein the light-emitting device layer comprises an anode, the light-emitting functional layer, and a cathode that are stacked, the anode is located on a side of the light-emitting functional layer facing the substrate, the cathode is located on a side of the light-emitting functional layer facing away from the substrate;

wherein the first light absorbing layer is disposed on a surface of the cathode facing the light-emitting side.

13. The display module according to claim 12, wherein when the light-emitting device layer is a top emission structure, the first light absorbing layer is located on a surface of the cathode facing away from the substrate.

14. The display module according to claim 13, wherein when the light-emitting device layer is the top emission structure, the display panel further comprises a second light absorbing layer, and the second light absorbing layer is located on a surface of a side of the anode facing sway from the substrate and is arranged corresponding to the non-light-emitting region.

15. The display module according to claim 14, wherein the anode comprises a first portion corresponding to the non-light-emitting region, and the second light absorbing layer covers the first portion of the anode.

16. The display module according to claim 14, wherein the second light absorbing layer is a semiconductor light absorbing material.

17. A display panel, comprising:

a substrate;

a light-emitting device layer disposed on the substrate, wherein the light-emitting device layer comprises a plurality of effective light-emitting regions and a non-light-emitting region located outside the plurality of effective light-emitting regions;

a first light absorbing layer disposed on a side of the light-emitting device layer facing a light-emitting side of the display panel; and a touch layer disposed on a side of the first light absorbing layer facing the light-emitting side;

wherein the first light absorbing layer is disposed corresponding to the non-light-emitting region;

wherein the touch layer comprises a touch electrode line and a third light absorbing layer, the touch electrode line is located in the non-light-emitting region, and the third light absorbing layer is located on a surface of a side of the touch electrode line facing away from the light-emitting device layer; and wherein the touch layer further comprises a first buffer layer, a conductive bridge, a dielectric layer, and a planarization layer.

18. The display panel according to claim 17, wherein the touch electrode line comprises a first touch electrode line and a second touch electrode line, and the first touch electrode line and the second touch electrode line form a mesh structure.

* * * * *